(12) United States Patent
Saeki et al.

(10) Patent No.: US 7,167,805 B2
(45) Date of Patent: Jan. 23, 2007

(54) DEVICE FOR CORRECTING REFERENCE POSITION FOR TRANSFER MECHANISM, AND CORRECTION METHOD

(75) Inventors: Hiroaki Saeki, Nirasaki (JP); Toshio Kamigaki, Toyohashi (JP)

(73) Assignees: Tokyo Electron Limited, Tokyo-To (JP); Shinko Electric Co, Ltd., Tokyo-To (JP)

( * ) Notice: Subject to any disclaimer, the term of this patent is extended or adjusted under 35 U.S.C. 154(b) by 0 days.

(21) Appl. No.: 10/534,709

(22) PCT Filed: Nov. 13, 2003

(86) PCT No.: PCT/JP03/14479

§ 371 (c)(1),
(2), (4) Date: May 13, 2005

(87) PCT Pub. No.: WO2004/043653

PCT Pub. Date: May 27, 2004

(65) Prior Publication Data

US 2006/0015279 A1   Jan. 19, 2006

(30) Foreign Application Priority Data

Nov. 14, 2002 (JP) .............................. 2002-331213

(51) Int. Cl.
*G01P 21/00* (2006.01)
*G06F 19/00* (2006.01)

(52) U.S. Cl. ...................................................... 702/94

(58) Field of Classification Search ................... 702/94, 702/95, 150–154
See application file for complete search history.

(56) References Cited

U.S. PATENT DOCUMENTS 6,510,365 B1 * 1/2003 Nishinakayama et al. .. 700/214
6,514,345 B1 * 2/2003 Nagata et al. ............... 118/697

FOREIGN PATENT DOCUMENTS

JP 03-104575 5/1991

(Continued)

OTHER PUBLICATIONS

International Preliminary Examination Report (PCT/IPEA/409) (Translated) for PCT/JP2003/014479.

(Continued)

*Primary Examiner*—Michael Nghiem
(74) *Attorney, Agent, or Firm*—Smith, Gambrell & Russell, LLP

(57) ABSTRACT

Disclosed herein is a conveying mechanism disposed in a conveying vessel which includes: a moving member which can move in a horizontal moving direction; a rotary table attached to the moving member such that the rotary table can turn in a horizontal turning direction and move in the vertical direction; and two arm mechanisms which can bend and stretch in a horizontal operating direction relative to the rotary table. Also disclosed herein is a reference position correcting device for the conveying mechanism and methods of correcting reference positions of the conveying mechanism. The reference position correcting device includes: a light emitter for emitting a sensing light beam; a light detector for receiving the sensing light beam; and a correcting device.

15 Claims, 13 Drawing Sheets

FOREIGN PATENT DOCUMENTS

| | | |
|---|---|---|
| JP | 10-329083 | 12/1998 |
| JP | 2000-127069 | 5/2000 |
| JP | 2001-156153 | 6/2001 |
| JP | 2001-252883 | 9/2001 |
| JP | 2002-064128 | 2/2002 |

OTHER PUBLICATIONS

Notification of Transmittal of Copies of Translation of the International Preliminary Examination Report issued for PCT/JP2003/014479.

* cited by examiner

DEVICE FOR CORRECTING REFERENCE POSITION FOR TRANSFER MECHANISM, AND CORRECTION METHOD

TECHNICAL FIELD

The present invention relates to a device and a method of correcting reference positions of a conveying mechanism relative to various operational directions, the conveying mechanism being used in a treatment system for a semiconductor wafer or the like.

BACKGROUND ART

In order to manufacture a semiconductor integrated circuit, a wafer is generally subjected to various treatments such as film-forming, etching, oxidation, and diffusion treatments. In connection with a finer, higher integration of a semiconductor integrated circuit, a so-called clustered treatment system has been introduced to improve a throughput and a yield. Such a clustered system includes a plurality of treatment apparatuses for carrying out the same or different treatments, the apparatuses being connected to each other through a common conveying vessel. Thus, wafers can be continuously subjected to various treatments, without being exposed to an atmosphere.

In this type of treatment system, by using a conveying mechanism disposed in a conveying vessel, semiconductor wafers are taken out from a cassette vessel disposed on an inlet port, and are taken into the conveying vessel. The semiconductor wafers taken into the conveying vessel are aligned with each other by an orienter, and then loaded in a load lock vessel, which is capable of forming a vacuum, by means of the conveying mechanism. The wafers loaded in the load lock vessel are loaded in a common conveying vessel of vacuum atmosphere, by means of another conveying mechanism disposed in the common conveying vessel. A plurality of treatment vessels of vacuum atmosphere are connected to each other to surround the common conveying vessel. Wafers are sequentially sent into the respective treatment vessels via the common conveying vessel, so that the wafers are continuously subject to various treatments. The treated wafers are reversely sent along the original course, and are contained in the original cassette vessel.

As described above, the treatment system of this type generally includes a plurality of conveying mechanisms. Wafers are automatically delivered, received, and conveyed by means of the conveying mechanisms.

For example, the conveying mechanism is formed of an articulated arm capable of moving both horizontally and vertically, bending, stretching, and turning. A wafer as an object to be conveyed, which is directly held by a pick disposed on a distal end of the arm, is conveyed to a predetermined position. Japanese Patent Laid-Open Publication No. 338554/1994 shows an example of such a conveying mechanism including two conveying arms capable of bending and stretching, disposed on a rotary table. The conveying arms are spaced apart from each other, and have perpendicular rotational axes, respectively. Another example of such a conveying mechanism is shown in Japanese Patent Laid-Open Publication No. 284049/1999, which includes a first arm which can turn on a table, and two second arms connected to a distal end of the first arm which can rotate in a horizontal plane independently from each other.

In these conveying mechanisms, during an operation thereof, an arm, a pick, and a wafer should be prevented from colliding or interfering with other members. Further, a wafer disposed on a certain position should be properly held, and the wafer should be conveyed to a desired position and positioned thereon with high positional accuracy of within, e.g., ±0.20 mm.

Thus, when a system including a conveying mechanism is fabricated, or drastically remodeled, a so-called teaching operation is carried out for inputting positional information represented by position coordinates to a controller, e.g. a computer. As the positional information, important positions such as a position where a wafer is delivered and received in a channel where a pick is moved in the conveying mechanism, are input to the controller.

When the system is fabricated or drastically remodeled, errors such as a process error and an assembly error of members, and an error caused by a resolution of an encoder inevitably occur. Thus, prior to the teaching operation, a reference position should be corrected (calibrated) by calculating a deviation amount which indicates how an operational coordinate showing an actual position of the conveying mechanism in operation deviates from a theoretical coordinate determined by designing dimensions of a treatment system. The correction is executed relative to all the directions where the conveying mechanism moves. That is, when the conveying mechanism moves horizontally, a reference position is corrected in the horizontal moving direction (also referred to as "X direction"). When the conveying mechanism moves vertically, a reference position is corrected in the vertical direction (Z direction). At the same time, reference positions are corrected in a horizontal turning direction where an arm turns (θ direction), and in a horizontal operating direction where the arm bends and stretches (R direction).

An example of a method of correcting a reference position is disclosed in the specification of U.S. Pat. No. 5,535,306, in which coordinates of a conveying arm are automatically corrected in the R direction and the θ direction. According to this method, a wafer holding part of a conveying arm disposed in a common conveying vessel moves therein. A position of the wafer holding part is detected by a light sensor having a vertical optical axis. In this case, the reference positions can be corrected only in the R direction and the θ direction with one sensing light beam of the sensor. That is, reference positions cannot be corrected in other directions, i.e., the X direction and the Z direction.

Another example of a method of correcting a reference position is disclosed in Japanese Patent Laid-Open Publication No. 254359/1999, in which the respective coordinates of a conveying arm in the R, θ, and Z directions are automatically detected, and reference positions are corrected based on these coordinates. In this method, a wafer holding part of a conveying arm disposed in a common conveying vessel moves in a treatment vessel or the like connected to the common conveying vessel. The respective coordinates of the wafer holding part in the R, θ, and Z directions are automatically detected by a first light sensor having a vertical optical axis and a second light sensor having a horizontal optical axis. In this case, the reference position can be corrected only in the R, θ, and Z directions, by means of the two sensing light beams of the light sensors, and a correction of a reference position in the X direction cannot be carried out.

SUMMARY OF THE INVENTION

The present invention has been made in view of the above difficulties so as to effectively solve the same. An object of the present invention is to provide a reference position correcting device having a simple structure and a reference position correcting method for a conveying mechanism, in which reference positions in all the X, Z, θ, and R directions can be corrected with one sensing light beam.

In order to achieve the above object, according to a first aspect of the present invention, there is provided a reference position correcting device for a conveying mechanism including: a moving member disposed in a conveying vessel, the moving member being capable of moving in a horizontal moving direction; a rotary table attached to the moving member, the rotary table being capable of turning in a horizontal turning direction and moving in a vertical direction; two arm mechanisms attached to the rotary table through vertical rotary shafts spaced apart from each other, the arm mechanisms being capable of bending and stretching in a horizontal operating direction; and picks attached on distal ends of the respective arm mechanisms, each for holding an object to be conveyed; the correcting device comprising: a light emitter fixedly positioned on the conveying vessel, for emitting a sensing light beam in a horizontal direction crossing the moving direction of the moving member; a light detector fixedly positioned on the conveying vessel to receive the sensing light beam, for detecting a light-transmitting state and a light-shielding state of the sensing light beam; a light-shielding member attached on the rotary table, for switching the sensing light beam between the light-transmitting state and the light-shielding state in compliance with a movement and a turn of the rotary table; and correcting means for correcting reference positions of the rotary table in the moving, vertical, and turning directions, and for correcting a reference position of the arm mechanism in the operating direction, based on a detection by the light detector about the light-transmitting state and the light-shielding state of the sensing light beam switched in compliance with the movement and the turn of the rotary table.

In the reference position correcting device, the correction means corrects, for example: the reference position of the rotary table in the moving direction, based on a position where a horizontal end of the rotary table switches the sensing light beam between the light-transmitting state and the light-shielding state; the reference position of the rotary table in the vertical direction, based on a position where an upper end of the rotary table or the light-shielding member switches the sensing light beam between the light-transmitting state and the light-shielding state; the reference position of the rotary table in the turning direction, based on a position where the light-shielding member switches the sensing light beam between the light-transmitting state and the light-shielding state; and the reference position of the arm mechanism in the operating direction, based on a position where a part of the pick or a part of the arm mechanism switches the sensing light beam between the light-transmitting state and the light-shielding state.

In the reference position correcting device the light-shielding member is, for example, formed of a light-shielding plate projecting upward from an upper surface of the rotary table.

In this case, it is preferable that the light-shielding member includes a first light-shielding plate disposed on a rotary center of the rotary table, and a second light-shielding plate disposed at a peripheral portion of the rotary table; and that each of the light-shielding plates has a light-transmitting hole formed in a center thereof.

As constituted above, it can be understood that a correction of a reference position is more properly carried out, by checking whether the sensing light beam transmits the light-transmitting holes.

According to the first aspect of the present invention, there is further provided a reference position correcting device for a conveying mechanism including: a moving member disposed in a conveying vessel, the moving member being capable of moving in a horizontal moving direction; a table attached to the moving member, the table being capable of moving in a vertical direction; an arm mechanism attached to the table, the arm mechanism being capable of turning in a horizontal turning direction and bending and stretching in a horizontal operating direction; and a pick attached on a distal end of the arm mechanism, for holding an object to be conveyed; the correcting device comprising: a light emitter fixedly positioned on the conveying vessel, for emitting a sensing light beam in a horizontal direction crossing the moving direction of the moving member; a light detector fixedly positioned on the conveying vessel to receive the sensing light beam, for detecting a light-transmitting state and a light-shielding state of the sensing light beam; and correcting means for correcting reference positions of the table in the moving and vertical directions, and for correcting reference positions of the arm mechanism in the turning and the operating direction.

In the reference position correcting device, the correcting means corrects, for example: the reference position of the table in the moving direction, based on a position where a horizontal end of the table switches the sensing light beam between the light-transmitting state and the light-shielding state; the reference position of the table in the vertical direction, based on a position where a part of the arm mechanism, a part of the pick, or an upper end of the table switches the sensing light beam between the light-transmitting state and the light-shielding stated; the reference position of the arm mechanism in the turning direction, based on a position where a part of the arm mechanism switches the sensing light beam between the light-transmitting state and the light-shielding state; and the reference position of the arm mechanism in the operating direction, based on a position where a part of the pick or a part of the arm mechanism switches the sensing light beam between the light-transmitting state and the light-shielding state.

According to a second aspect to the present invention, there is provided a method of correcting reference positions of a conveying mechanism including: a moving member disposed in a conveying vessel, the moving member being capable of moving in a horizontal moving direction; a rotary table attached to the moving member, the rotary table being capable of turning in a horizontal turning direction and moving in a vertical direction; two arm mechanisms attached to the rotary table through vertical rotary shafts spaced apart from each other, the arm mechanisms being capable of bending and stretching in a horizontal operating direction; and picks attached on distal ends of the respective arm mechanisms, each for holding an object to be conveyed; the method comprising the steps of: emitting a sensing light beam from a light emitter to a light detector each being fixedly positioned on the conveying vessel, in a horizontal direction crossing the moving direction of the moving member; correcting the reference position of the rotary table in the moving direction, based on a position where a horizontal end of the rotary table switches the sensing light beam between a light-transmitting state and a light-shielding state; correcting the reference position of the rotary table in the vertical direction, based on a position where an upper end of the rotary table or a light-shielding member attached on the rotary table switches the sensing light beam between the light-transmitting state and the light-shielding state; correcting the reference position of the rotary table in the turning direction, based on a position where the light-shielding member switches the sensing light beam between the light-transmitting state and the light-shielding state; and correcting the reference position of the arm mechanism in the operating direction, based on a position where a part of the pick or a part of the arm mechanism switches the sensing light beam between the light-transmitting state and the light-shielding state.

According to the second aspect of the present invention, there is further provided a method of correcting reference positions of a conveying mechanism including: a moving member disposed in a conveying vessel, the moving member being capable of moving in a horizontal moving direction; a table attached to the moving member, the table being capable of moving in a vertical direction; an arm mechanism attached to the table, the arm mechanism being capable of turning in a horizontal turning direction and bending and stretching in a horizontal operating direction; and a pick attached on a distal end of the arm mechanism, for holding an object to be conveyed; the method comprising the steps of: emitting a sensing light beam from a light emitter to a light detector each being fixedly positioned on the conveying vessel, in a horizontal direction crossing the moving direction of the moving member; correcting the reference position of the table in the moving direction, based on a position where a horizontal end of the table switches the sensing light beam between a light-transmitting state and a light-shielding state; correcting the reference position of the table in the vertical direction, based on a position where a part of the arm mechanism, a part of the pick, or an upper end of the table switches the sensing light beam between the light-transmitting state and the light-shielding state; correcting the reference position of the arm mechanism in the turning direction, based on a position where a part of the arm mechanism switches the sensing light beam between the light-transmitting state and the light-shielding state; and correcting the reference position of the ram mechanism in the operating direction, based on a position where a part of the pick or a part of the arm mechanism switches the sensing light beam between the light-transmitting state and the light-shielding state.

As described above, according to the present invention a reference position correcting device and a reference position correcting method for a conveying mechanism can be provided, in which reference positions are corrected in the all the X, Z, θ, and R directions can be corrected with one sensing light beam.

BEST MODE FOR CARRYING OUT THE INVENTION

Embodiments of a reference position correcting device and a correcting method for a conveying mechanism according to the present invention are described below, with reference to the accompanying drawings.

Referring to FIGS. 1 to 10, a treatment system including a reference position correcting device for a conveying mechanism in a first embodiment of the present invention is described below.

Figure 1:
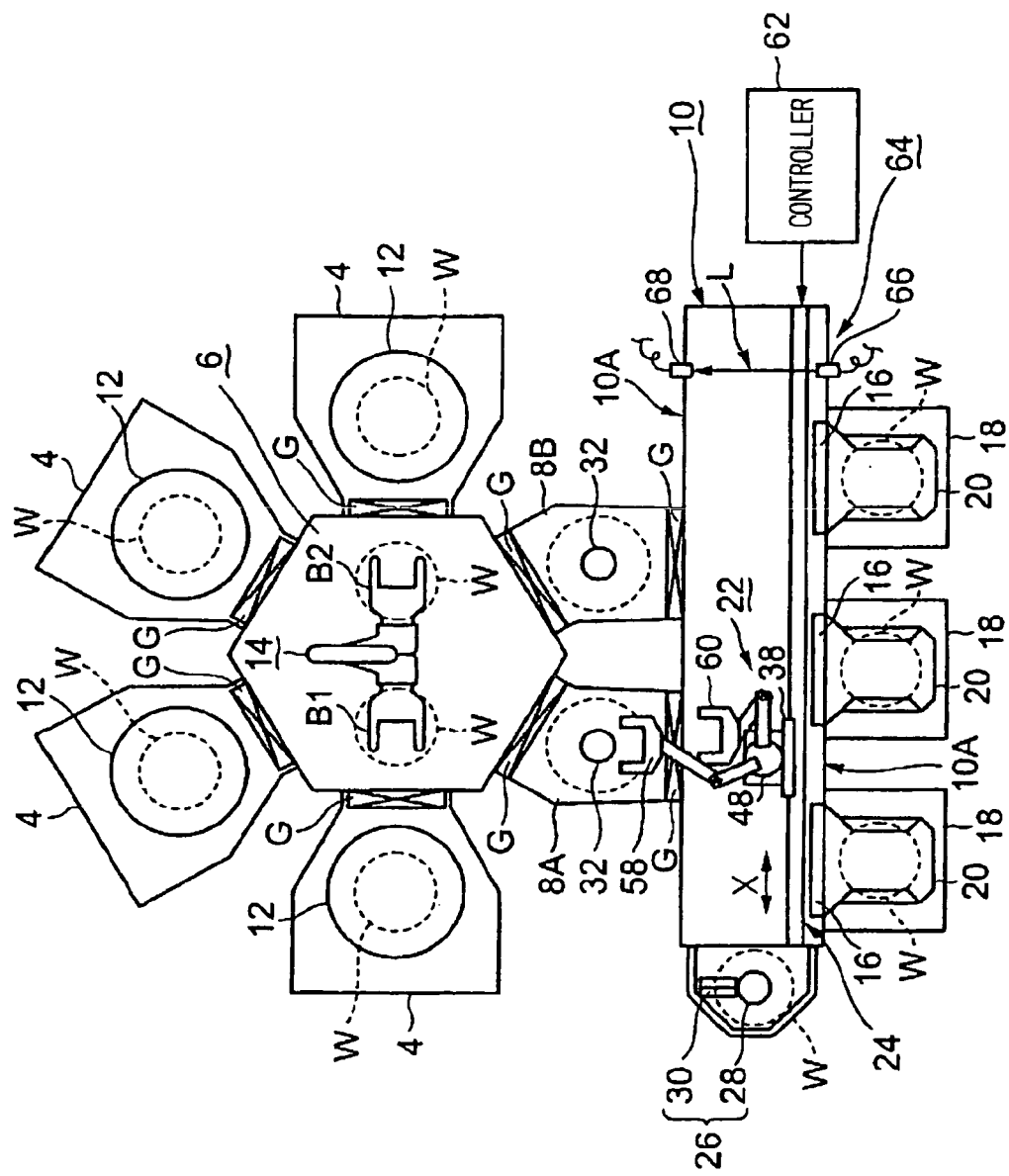
FIG. 1 is a structural view of an example of a treatment system including a reference position correcting device for a conveying mechanism in one embodiment of the present invention.

As shown in FIG. 1, a treatment system 2 includes four treatment vessels 4, a hexagonal common conveying vessel 6, a first load lock vessel 8A, a second load lock vessel 8B, and an elongated inlet-side conveying vessel 10.

To be specific, the treatment vessels 4 are connected to four side surfaces of the common conveying vessel 6, while the first and the second load lock vessels 8A and 8B are connected to the rest two side surfaces of the common conveying vessel 6. The inlet-side conveying vessel 10 is commonly connected to the first and the second load lock vessel 8A and 8B. A first conveying mechanism 22 is disposed in the inlet-side conveying vessel 10.

The common conveying vessel 6 and each of the four treatment vessels 4 are connected through a gate valve G which can air-tightly close a space therebetween, to provide a cluster tool formation. Similarly, the common conveying vessel 6 and each of the first and the second load lock vessels 8A and 8B are connected through the gate valve G which can air-tightly close a space therebetween, to provide a cluster tool formation. Between each of the load lock vessels 8A and 8B and the inlet-side conveying vessel 10, there is interposed the gate G which can air-tightly close a space therebetween.

A susceptor 12 for mounting thereon a semiconductor wafer is disposed in the respective four treatment vessels 4. The four treatment vessels 4 perform the same or different treatments to a wafer W. A second conveying mechanism 14 is disposed in the common conveying vessel 6 at a position where the second conveying mechanism 14 can access the two load lock vessels 8A and 8B and the four treatment vessels 4. The second conveying mechanism 14 is formed of an articulated arm capable of bending, stretching, vertically moving, and turning. The second conveying mechanism 14 is provided with two picks B1 and B2 which can bend and stretch independently from each other in opposite directions, so that two wafers W can be handled at once. The second conveying mechanism 14 having one pick may be used.

The inlet-side conveying vessel 10 is formed of an elongated box. Three loading ports for introducing a wafer into the inlet-side conveying vessel 10 are formed in one side surface thereof. Each of the loading ports is provided with a door 16 capable of being shut. An inlet port 18 is disposed for each loading port. A cassette vessel 20 can be mounted on each of the inlet ports 18. The cassette vessel 20 can contain therein a plurality of, for example, 25 wafers W disposed at equal pitches in a tier-like manner.

An orienter 26 for aligning wafers is disposed on one end of the conveying vessel 10. The orienter 26 has a rotary table 28 rotated by a driving motor, so that the orienter 26 can rotate with the wafers W being mounted on the rotary table 28. An optical sensor 30 is disposed at a circumference of the rotary table 28, for detecting a periphery of the wafer W. The sensor 30 can detect an orientation of a cutout for positioning the wafer W, such as a notch or an orientation flat, and a center position of the wafer W.

The first conveying mechanism 22 is disposed in the conveying vessel 10, for conveying the wafer W as an object to be conveyed inside the conveying vessel 10. The first conveying mechanism 22 is slidably supported on a horizontally, longitudinally extending guide rail 24 which is formed in one side surface of the conveying vessel 10 facing the inlet ports 18. A moving mechanism such as a linear motor 40 having, e.g., an encoder is incorporated in the guide rail 24. The first conveying mechanism 22 is driven by the linear motor 40 to move along the guide rail 24.

Figure 2:
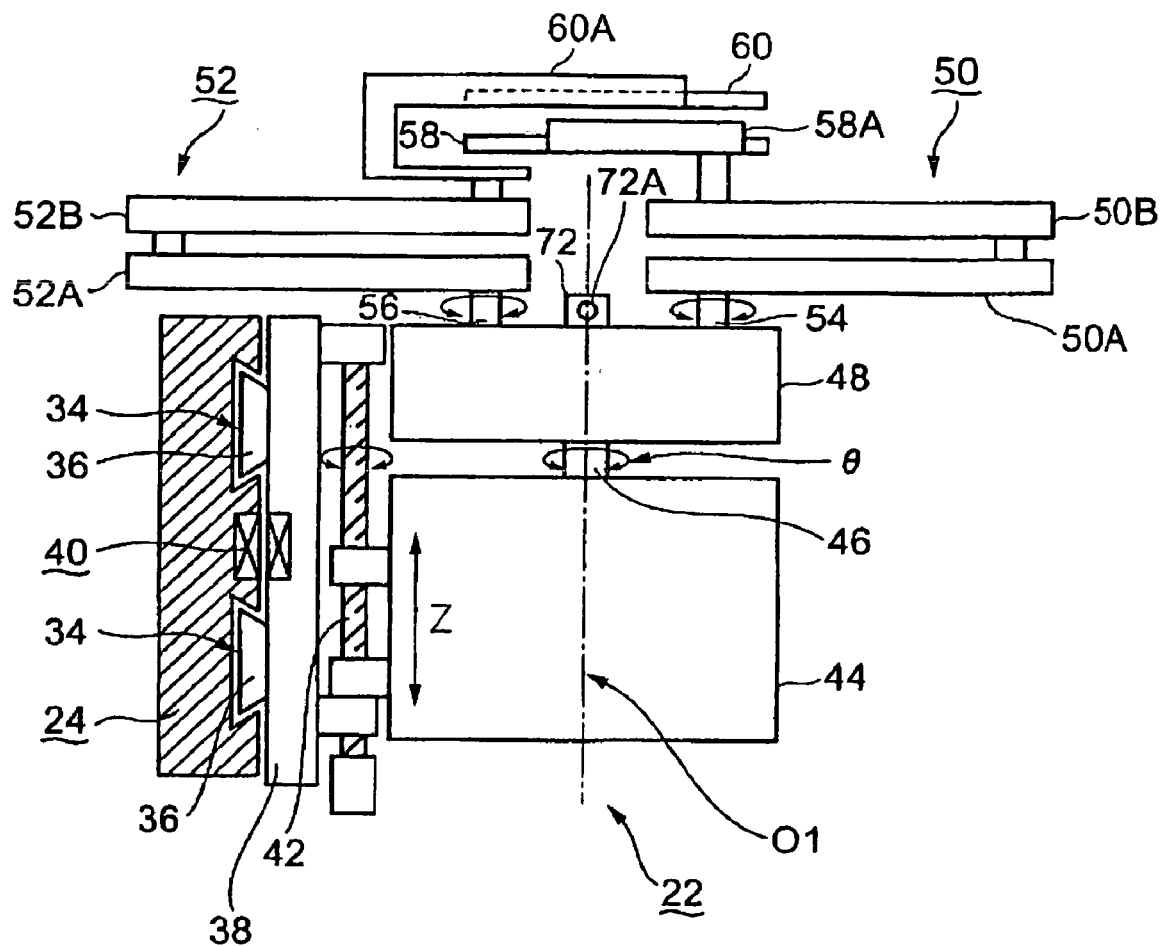
FIG. 2 is a side view of the conveying mechanism shown in FIG. 1.

The two load lock vessels 8A and 8B are disposed on the other side surface of the conveying vessel 10 through the gate valves G. Each of the load lock vessels 8A and 8B has a mounting table 32 for mounting temporarily thereon the wafer W. The mounting table 32 has a smaller diameter than that of the wafer W to be mounted thereon. As shown in FIG. 2, the first conveying mechanism 22 is provided with a moving member 38 having two leg parts 36. The leg parts 36 are fitted in two guide grooves 34 formed in parallel with the guide rail 24. The linear motor 40 is disposed between the moving member 38 and the guide rail 24. Thus, the moving member 38 can be moved along the guide rail 24 in the horizontal moving direction, i.e., in the X direction.

A base 44 is attached to the moving member 38 through a ball screw 42, such that the base 44 can move in the vertical direction, i.e., in the Z direction. A cylindrical rotary table 48 is attached to the base 44 through a rotary shaft 46 which can be controllably driven in the horizontal turning direction, i.e., in the $\theta$ direction. That is, the rotary table 48 is attached to the moving member 38 such that the rotary table 48 can horizontally turn and vertically move relative to the moving member 38.

The rotary table 48 has thereon two arm mechanisms 50 and 52 each of which is formed of an articulated arm capable of bending and stretching in the horizontal operating direction.

The arm mechanisms 50 and 52 are respectively attached to vertical rotary shafts 54 and 56 which are spaced apart from each other symmetrically about a point of a rotary center O1 of the rotary table 48.

The arm mechanism 50 has a first arm 50A and a second arm 50B which are bendably connected to each other, while the arm mechanism 52 has a first arm 52A and a second arm 52B which are bendably connected to each other. Picks 58 and 60 for holding the wafer W are bendably connected to distal ends of the respective second arms 50B and 52B. The picks 58 and 60 are connected to the second arms 50B and 52B through attachment parts 58A and 60A. The attachment parts 58A and 60A have larger thicknesses in the vertical direction than those of other parts of the respective picks 58 and 60 (see FIG. 8), in terms of reasons relating to a structure and a strength. When the rotary shafts 54 and 56 are rotated by a driving motor (not shown), the arm mechanisms 50 and 52 horizontally bend and stretch such that the picks 58 and 60 move in the operating direction (R direction) radial to the rotary shafts 54 and 56, respectively.

Referring again to FIG. 1, the treatment system 2 is provided with a reference position correcting device 64 according to the present invention. The reference position correcting device 64 includes a light emitter 66, a light detector 68, a light-shielding member 70 (see FIG. 3), and correcting means. The light emitter 66 and the light detector 68 are fixedly positioned on the conveying vessel 10. The light-shielding member 70 is attached on the rotary table 48. The correcting means corrects reference positions in the respective directions based on a result detected by the light detector 68. The treatment system 2 is provided with a controller 62 such as a microcomputer for controlling an operation of the treatment system 2 as a whole. The controller 62 functions as the correcting means for correcting the reference positions.

The light emitter 66 emits a sensing light beam L in the horizontal direction crossing the moving direction (X direction) of the moving member 38. The light detector 68 is secured on a position where the light detector 68 receives the emitted sensing light beam L, so as to detect whether the sensing light beam L is transmitted or shielded. The light-shielding member 70 switches the sensing light beam L between a light-transmission state and a light-shielding state, in compliance with a movement of the rotary table 48 (moving member 38) and a turning of the rotary table 48.

A conveying system is composed of the reference position correcting device 64, the first conveying mechanism 22, and the inlet-side conveying vessel 10.

Specifically, the light emitter 66 and the light detector 68 are attached on opposed sidewalls 10A of the conveying vessel 10 at predetermined positions. An LED or a laser element may be used as the light emitter 66. The light emitter 66 and the light detector 68 are attached on the sidewalls 10A such that the light emitter 66 and the light detector 68 do not interfere with operations of other members, such as the inlet ports 18 and the load lock vessels 8A and 8B. The controller 62 as the correcting means corrects reference positions in the X, Z, $\theta$, and R directions, based on positions where the members of the first conveying mechanism 22 switch the sensing light beam L between the light transmitting state and the light shielding state.

Figure 3:
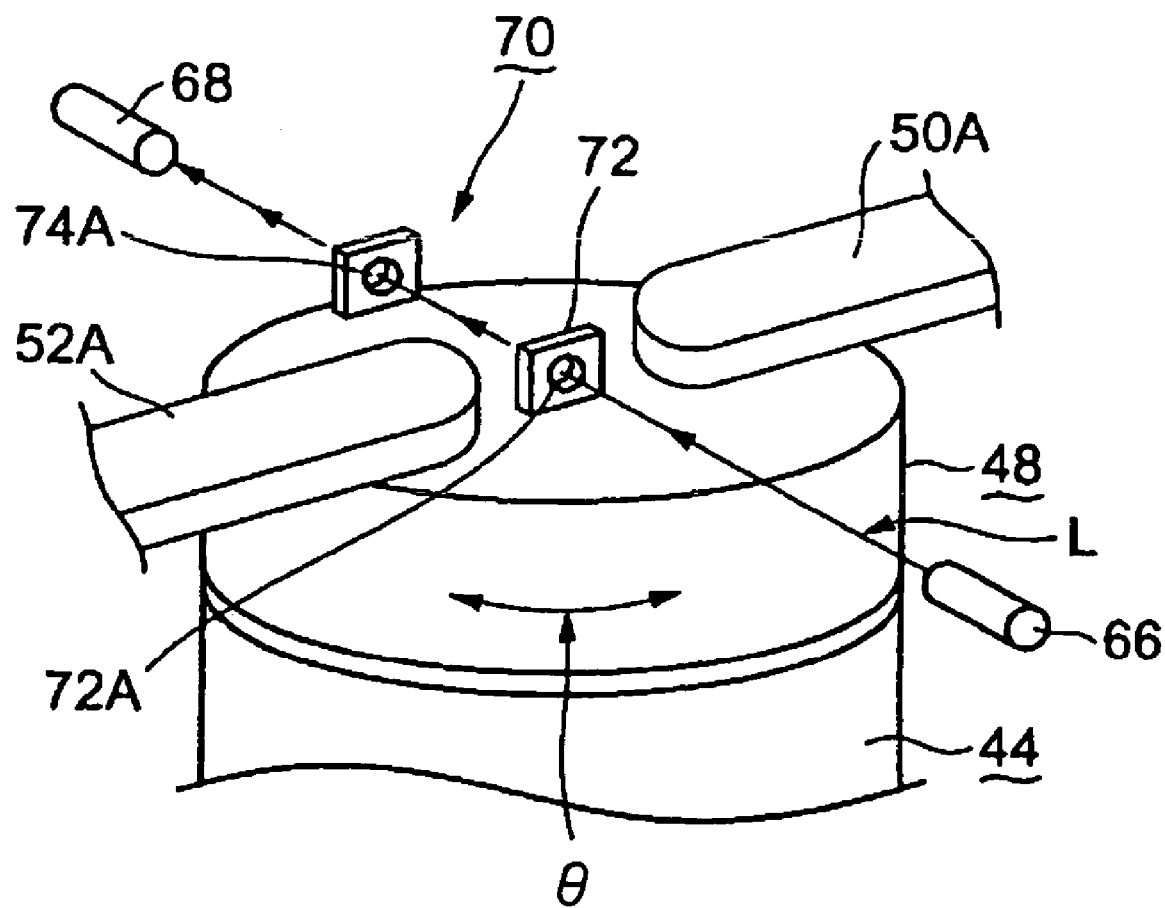
FIG. 3 is a perspective view of an attachment state of the conveying mechanism and the reference position correcting device shown in FIG. 1.

As shown in FIG. 3, the light-shielding member 70 includes a first light-shielding plate 72 and a second light-shielding plate 74 each projects upward from a flat upper surface of the rotary table 48. Light-transmitting holes 72A and 74A are respectively formed in the light-shielding plates 72 and 74 in their center region. Each of the shielding plates 72 and 74 is, for example, about 12 mm high by about 18 mm wide in size. Each of the light-transmitting holes 72A and 74A is about 2 mm in diameter.

Figure 4:
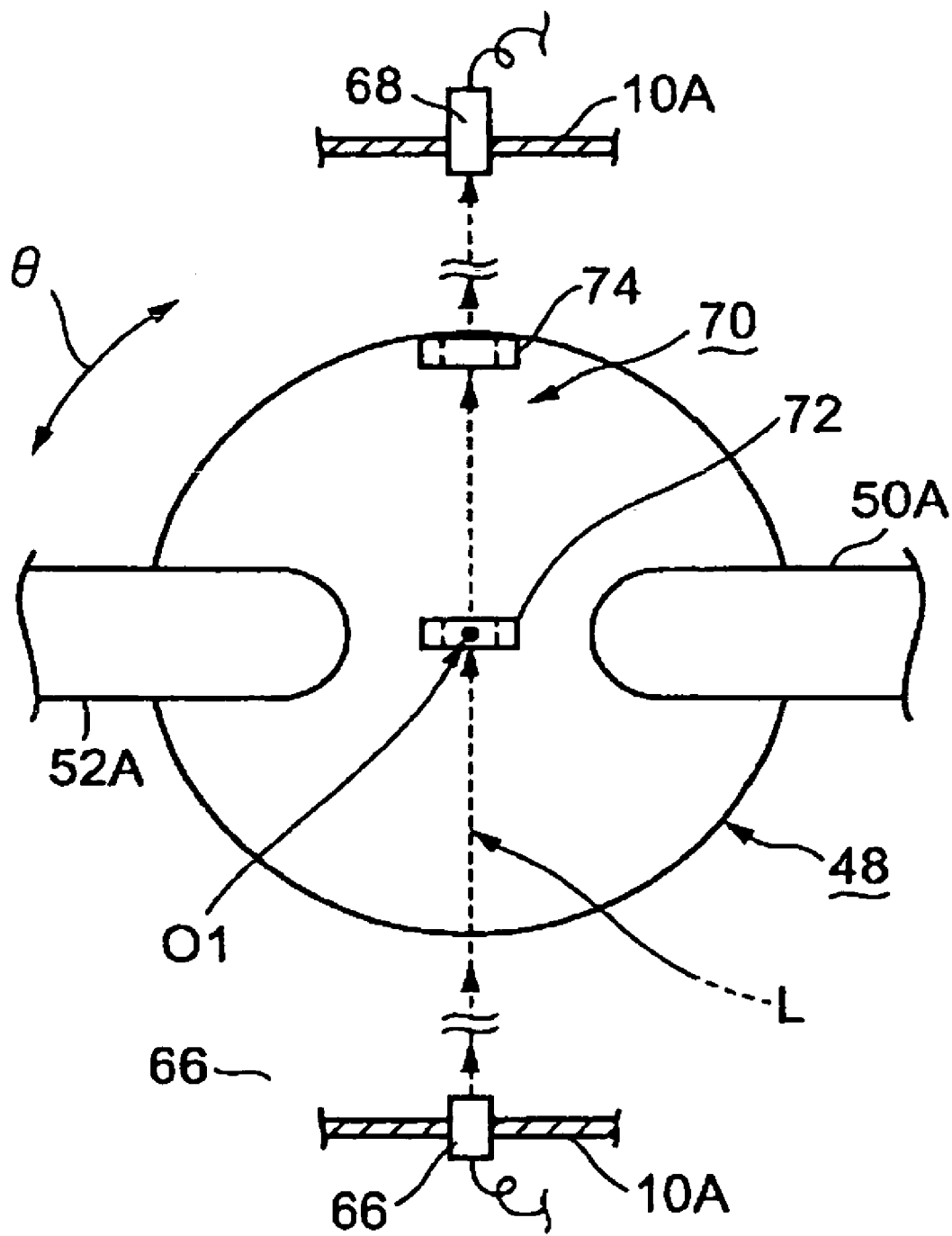
FIG. 4 is a plan view of an attachment state of the conveying mechanism and the reference position correcting device shown in FIG. 1.

As shown in FIGS. 2 and 3, the first light-shielding plate 72 is positioned on the rotary center O1 of the rotary table 48. As shown in FIG. 3, the second light-shielding plate 74 is positioned at a peripheral portion of the rotary table 48. As shown in FIGS. 3 and 4, when the rotary table 48 is oriented at a predetermined turning angle, the sensing light beam L transmits the light-transmitting holes 72A and 74A to reach the light detector 68. Thus, when the rotary table 48 turns even at a small turning angle, the sensing light beam L is switched between the light-transmitting state and the light-shielding state.

A method of correcting a reference position of the first conveying mechanism 22 carried out by the reference position correcting device 64 as constituted above is described below.

Firstly, based on a layout drawing of the treatment system 2, positions where each of certain parts of the first conveying mechanism 22 theoretically switches the sensing light beam L between the light-transmitting state and the light-shielding state (for example, from the light-transmitting state to the light-shielding state) are previously calculated as theoretical reference positions, that is, origins in coordinates in design in the respective directions.

Next, a reference position correction is carried out such that actual reference positions of the operating first conveying mechanism 22 in the respective X, Z, θ, and R directions correspond to the theoretical reference positions. In this case, operation data, reference position correction data, and so on are all stored in the controller 62 as the correcting means.

Generally, mechanical error dimensions of reference positions are about ±10 mm in the X direction, about ±4 mm in the Z direction, about ±2 mm in the θ direction, and about ±5 mm in the R direction.

<Reference Position Correction in X Direction>

Figure 5:
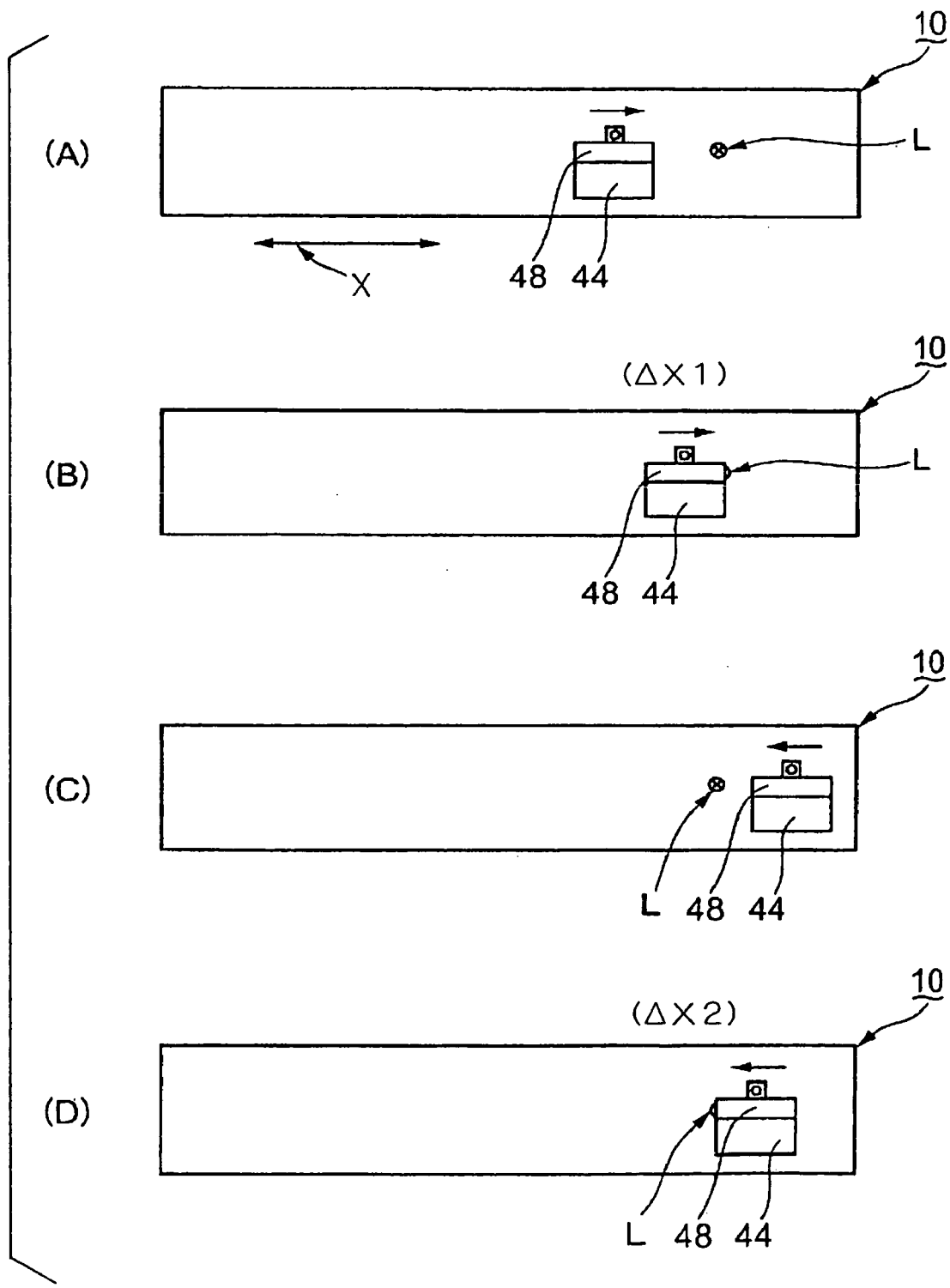
FIG. 5 is a schematic, longitudinally sectional view when a reference position is corrected in the X direction by the correcting device shown in FIG. 1.

With reference to FIG. 5, a method of correcting a reference position in the X direction is described below. When a reference position is corrected in the X direction, the light-shielding plates 72 and 74 are not used. A reference position (origin) in the X axis is defined as a position where the rotary center O1 of the rotary table 48 crosses the sensing light beam L.

At first, as shown in FIG. 5(A), the first conveying mechanism 22 (the base 44 and the rotary table 48) is slightly moved from the sensing light beam L in the X direction, such that the first conveying mechanism 22 is spaced apart from the sensing light beam L by, e.g., about 30 mm. Then, a position of the first conveying mechanism 22 is adjusted in the Z direction such that the rotary table 48 on the base 44 is aligned with the sensing light beam L at substantially the same horizontal level. FIG. 5(A) shows the first conveying mechanism 22 being apart from the sensing light beam L on a left side thereof. Under this state, the sensing light beam L emitted from the light emitter 66 is received by the light detector 68.

Next, as shown in FIG. 5(B), the first conveying mechanism 22 is moved slowly toward the sensing light beam L. In accordance with the movement of the conveying mechanism 22, a horizontal end of the rotary table 48 (an end edge of the moving member in the moving direction, i.e., in the X direction) shields the sensing light beam L. Then, a position coordinate where the sensing light beam L changes into the light-transmission state is obtained, and the obtained coordinate is stored as a position coordinate ΔX1.

Then, as shown in FIG. 5(C), the first conveying mechanism 22 is moved in the X direction from the sensing light beam L such that the first conveying mechanism 22 is slightly apart from the sensing light beam L by e.g., 30 mm on the opposite side shown in FIG. 5(A), that is, on a right side thereof.

Thereafter, as shown in FIG. 5(D), the first conveying mechanism 22 is slowly moved toward the sensing light beam L. In accordance with the movement of the conveying mechanism 22, another horizontal end of the rotary table 48 shields the sensing light beam L. Then, a position coordinate where the sensing light beam L changes into the light-transmission state is obtained, and the obtained coordinate is stored as a position coordinate ΔX2.

Therefore, the two position coordinates ΔX1 and ΔX2 are obtained. Then, a positional deviation amount ΔX is calculated according to the following equation. That is, (ΔX1+ΔX2)/2=ΔX. A reference position is corrected in the X direction relative to the theoretical reference position (origin in the coordinate) by the positional deviation amount ΔX. In this manner, a correction of the reference position in the X direction is completed.

In this correction method, the two position coordinates ΔX1 and ΔX2 are obtained by bringing the first conveying mechanism 22 close to the sensing light beam L from the opposite sides in the X direction, so as to improve a precision in correcting a reference position. However, a reference position may be corrected by using either one of the position coordinate ΔX1 or ΔX2. In this case, a difference between the position coordinate ΔX1 or ΔX2 and a radius of the rotary table 48 is obtained. A reference position is corrected by using the difference as a positional deviation amount ΔX of the rotary center O1 (FIG. 4).

<Reference Position Correction in Z Direction>

Figure 6:
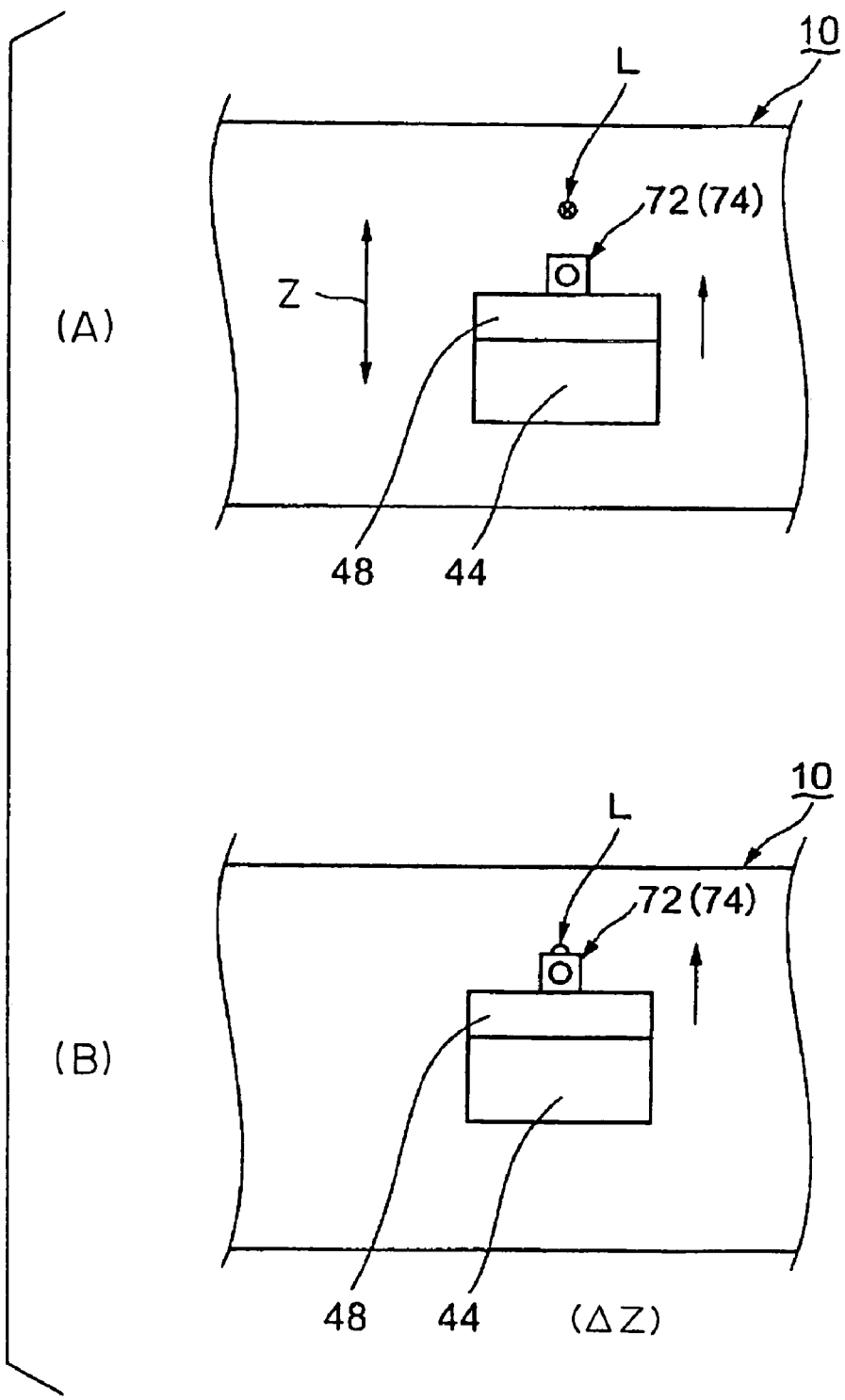
FIG. 6 is a schematic, longitudinally sectional view when a reference position is corrected in the Z direction by the correcting device shown in FIG. 1.

With reference to FIG. 6, a method of correcting a reference position in the Z direction is described below. A reference position (origin) in the Z axis is defined as a position where upper ends of the light-shielding plates 72 and 74 disposed on the rotary table 48 cross the sensing light beam L.

At first, as shown in FIG. 6(A), the first conveying mechanism 22 (the base 44 and the rotary table 48) is slightly moved below from the sensing light beam L in the Z direction, such that the first conveying mechanism 22 is spaced apart from the sensing light beam L by, e.g., about 15 mm. Then, a position of the rotary table 48, whose reference position has been corrected in the X direction, is adjusted such that the light-shielding plates 72 and 74 are positioned directly below the sensing light beam L. Since the reference position of the first conveying mechanism 22 has been already corrected in the X direction, the rotary table 48 can be precisely positioned right below the sensing light beam L.

Next, as shown in FIG. 6(B), the first conveying mechanism 22 is slowly raised toward the sensing light beam L. In accordance with the raising movement of the first conveying mechanism 22, the upper ends of the light-shielding plates 72 and 74 shield the sensing light beam L. Then, a position coordinate where the sensing light beam L changes into the light-transmission state is obtained, and the obtained coordinate is stored as a positional deviation amount ΔZ. Thereafter, a reference position is corrected relative to the theoretical reference position (origin in the coordinate) in the Z direction by the positional deviation amount ΔZ. In this manner, a correction of the reference position in the Z direction is completed.

A reference position may be corrected in the Z direction by obtaining a position where, in place of the upper ends of the light-shielding plates 72 and 74, an upper end of the rotary table 48 switches the sensing light beam L between the light-transmitting state and the light-shielding state.

<Reference Position Correction in θ Direction>

Figure 7:
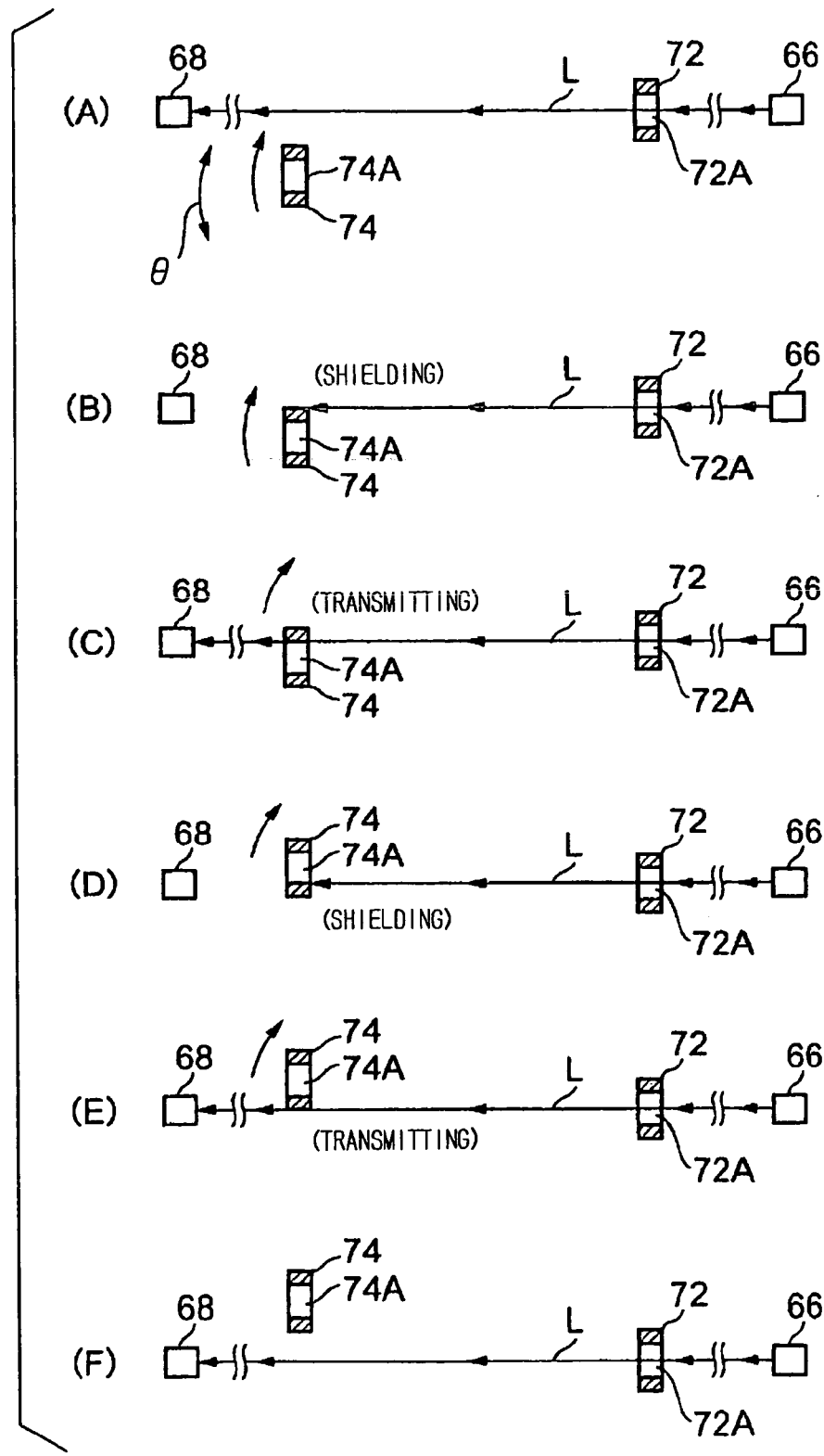
FIG. 7 is a schematic, horizontally sectional view when a reference position is corrected in the θ direction by the correcting device shown in FIG. 1.

With reference mainly to FIG. 7, a method of correcting a reference position in the θ direction is described below. A reference position (origin) in the θ axis is defined as a position where the sensing light beam L transmits a center of the light-transmitting holes 72A and 74A respectively formed in the light-shielding plates 72 and 74.

At first, the first conveying mechanism 22 is moved in the X and Z directions where the reference positions have been corrected. Then, an orientation of the first conveying mechanism 22 is adjusted such that an emitting direction of the sensing light beam L corresponds substantially to center parts of the light-shielding plates 72 and 74 disposed on the upper surface of the rotary table 48.

Under this state, as shown in FIG. 7(A), the rotary table 48 is slightly turned counterclockwise by, e.g., 7° in the θ direction (when viewed from above), so that the sensing light beam L deviates from the light transmitting hole 74A of the second light-shielding plate 74. At this time, since the first light-shielding plate 72 positioned on the rotary center O1 of the rotary table 48 is rarely moved, the sensing light beam L still transmits the light-transmitting hole 72A. In FIG. 7, since a turning motion amount of the second light-shielding plate 74 disposed at the peripheral portion of the rotary table 48 is slight, the turning movement of the second light-shielding plate 74 is shown as a translational movement.

Next, the rotary table 48 is slowly turned clockwise as indicated by the arrow. As shown in FIG. 7(B), in accordance with the turning movement of the rotary table 48, the sensing light beam L is switched from the light-transmitting state to the light-shielding state, because one edge of the second light-shielding plate 74 shields the sensing light beam L. As shown in FIG. 7(C), a further turning movement of the rotary table 48 allows the sensing light beam L to transmit the light-transmitting hole 74A of the second light-shielding plate 74. That is, the sensing light beam L is switched from the light-shielding state to the light-transmitting state.

Then, as shown in FIG. 7(D), when the rotary table 48 is further turned, the sensing light beam L passes the light-transmitting hole 74A of the second light-shielding plate 74, and is switched from the light-transmitting state to the light-shielding state. As shown in FIG. 7(E), with the further turning movement of the rotary table 48, the sensing light beam L passes the other edge of the second light-shielding plate 74, and is switched from the light-shielding state to the light-transmitting state.

When the rotary table 48 is further turned, the sensing light beam L is positioned slightly apart from the second light-shielding plate 74, as shown in FIG. 7(F). Then, a position coordinate where the sensing light beam L is secondly switched from the light-transmitting state to the light-shielding state (FIG. 7(D)) is obtained, and the obtained coordinate is stored as a position coordinate $\Delta\theta 1$.

Next, the rotary table 48 is slowly turned counterclockwise from the position shown in FIG. 7(F) to the position shown in FIG. 7(A). Then, a position coordinate where the sensing light beam is secondly switched from the light-transmitting state to the light-shielding state (FIG. 7(C)) is obtained, and the obtained coordinate is stored as a position coordinate $\Delta\theta 2$.

Therefore, the two position coordinates $\Delta\theta 1$ and $\Delta\theta 2$ are obtained. Then, a positional deviation amount $\Delta\theta$ is calculated according to the following equation. That is, $(\Delta\theta 1 + \Delta\theta 2)/2 = \Delta\theta$. A reference position is corrected in the θ direction relative to the theoretical reference position (origin in the coordinate) by the positional deviation amount $\Delta\theta$. In this manner, a correction of the reference position in the θ direction is completed.

<Reference Position Correction in R Direction>

Figure 8:
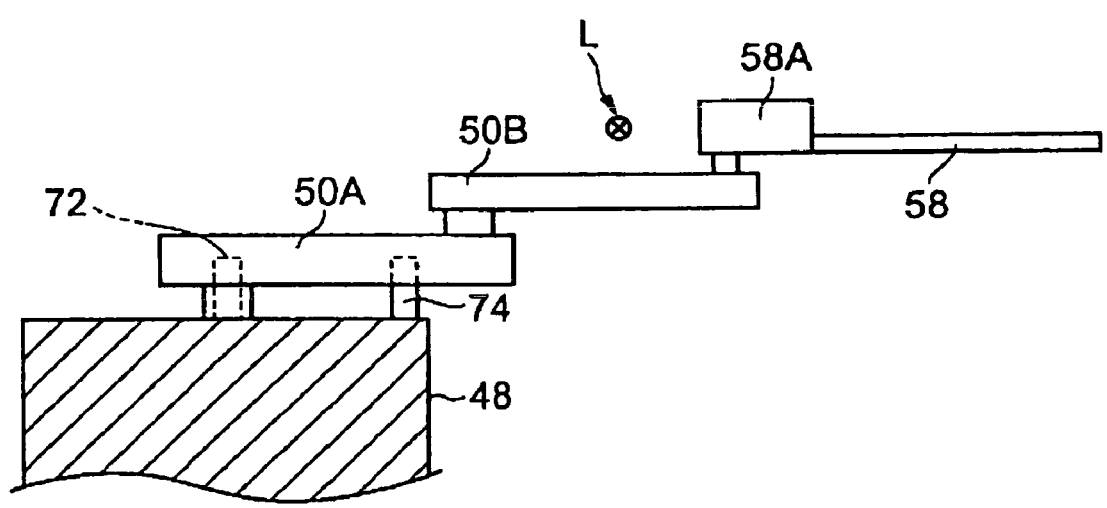
FIG. 8 is a schematic side view when a reference position is corrected in the R direction by the correcting device shown in FIG. 1.
Figure 9:
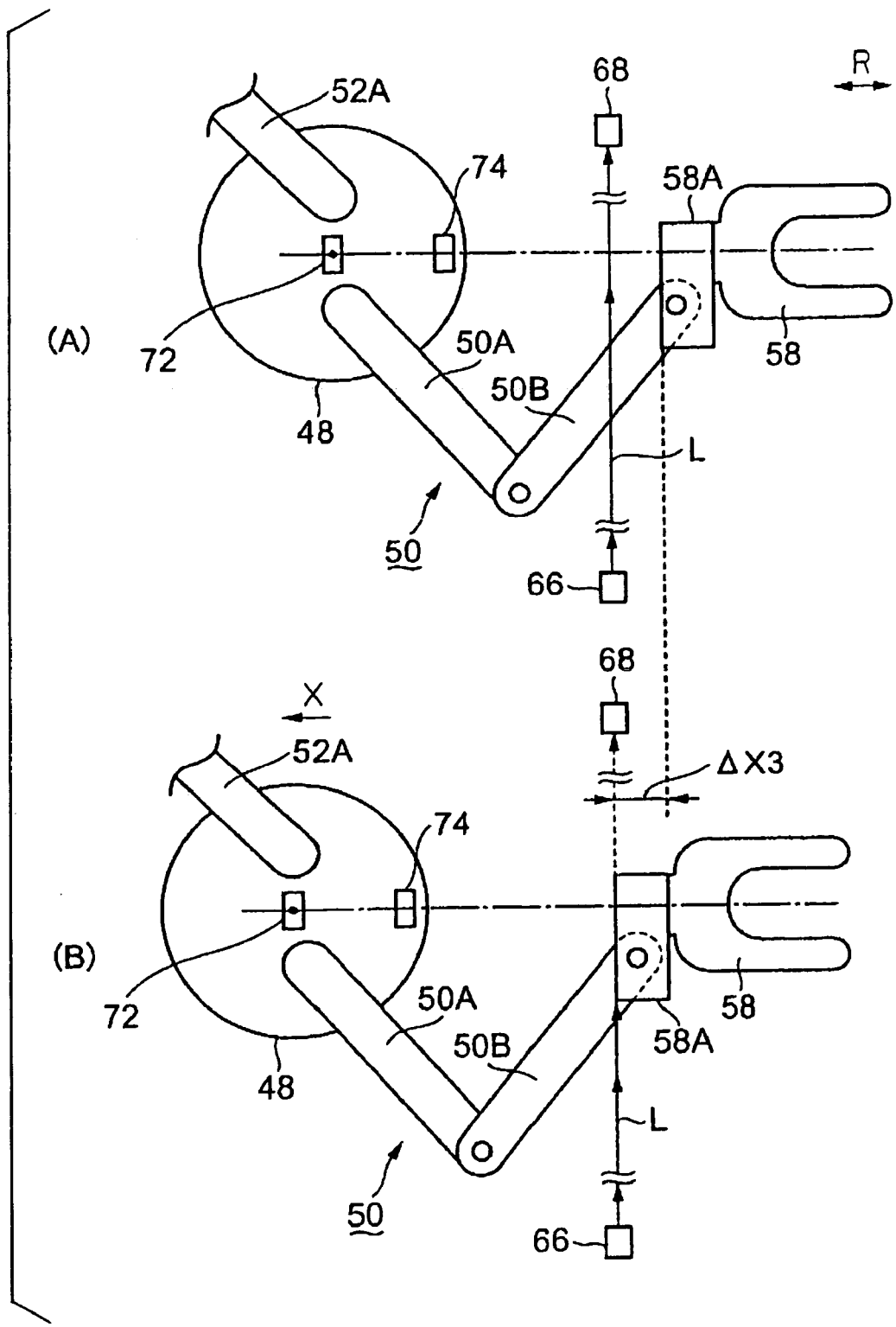
FIG. 9 is a schematic plan view when a reference position is corrected in the R direction by the correcting device shown in FIG. 1.

With reference to FIGS. 8 and 9, a method of correcting a reference position in the R direction (in the radial direction where the arm mechanism bends and stretches) is described below.

A method of correcting a reference position in the R direction is common to both the arm mechanisms 50 and 52. Thus, a method of correcting a reference position of the arm mechanism 50 in the R direction is described.

At first, as shown in FIG. 8, the first conveying mechanism 22 is moved in the X, Z, and θ directions where the reference positions have been corrected. Then, the arm mechanism 50 is adjusted in position, with being bent at a predetermined reference angle. For example, when a reach distance of the arm mechanism 50 is about 580 mm, the arm mechanism 50 is bent such that a distance between the rotary center O1 (FIG. 2) and a center of the pick is about 550 mm.

Then, a position of the pick 58 is adjusted such that the thickened attachment part 58A is aligned with the sensing light beam L at substantially the same horizontal level. At the same time, as shown in FIG. 8 and FIG. 9(A), a position of the attachment part 58A is adjusted such that the attachment part 58A is spaced apart from the sensing light beam L by, e.g., about 20 mm on one side (right side in FIG. 9) in the X direction.

After that, the first conveying mechanism 22 is slowly moved to the other side (left side in FIG. 9) in the X direction. As shown in FIG. 9(B), when the sensing light beam L is shielded by the attachment part 58A, a moving amount $\Delta X3$ of the first conveying mechanism 22 between the first position thereof and a position where the sensing light beam L is switched from the light-transmitting state to the light-shielding state is obtained and stored. Then, a positional deviation amount $\Delta R$ is calculated by subtracting a theoretical moving amount $\Delta X4$ from the moving amount $\Delta x3$. A reference position is corrected in the R direction relative to a theoretical reference position (origin in the coordinate) by the positional deviation amount $\Delta R$. In this manner, a correction of the reference position in the R direction is completed.

As described above, a reference position correction in the R direction is similarly carried out for the other arm mechanism 52. In correcting a reference position in the R direction, the sensing light beam L may be shielded by, in place of the attachment part 58A, pick 58 or other parts of the arm mechanism 50 which can shield the sensing light beam L. For example, a position of the second arm 50B is adjusted such that the second arm 50B is aligned with the sensing light beam L at substantially the same horizontal level. Then, the first conveying mechanism 22 is slowly moved to the one side (right side in FIG. 9) in the X direction. When a distal end of the second arm 50B shields the sensing light beam L, a moving amount of the first conveying mechanism 22 between the first position thereof and a position where the sensing light beam L is switched from the light-transmitting state to the light-shielding state is obtained. A reference position can be corrected in the R direction based on thus obtained moving amount of the first conveying mechanism 22.

As understood from above, reference positions can be corrected in the four axis, that is, in the X, Z, θ, and R directions, by means of a pair of light emitter 66 and the light detector 68, and the one sensing light beam L. As a result, it is possible to substantially correspond operation coordinates where the conveying mechanism actually moves to theoretical coordinates in which no consideration is made about errors such as fabrication errors in the treatment system.

In the first embodiment, in order to improve a detecting precision of the light by narrowing a light flux of the sensing light beam L, the first light-shielding plate 72 having the light-transmitting hole 72A is additionally disposed on the rotary center O1 of the rotary table 48. However, by omitting the first light-shielding plate 72, it is possible to dispose only the second light-shielding plate 74 at the peripheral portion of the rotary table 48.

Since the light-shielding plate 74 has the light-transmitting hole 74A, the sensing light beam L is frequently switched between the light-transmitting state and the light-shielding state, within a small range of the rotary table 48 at a small turning angle. The light detector 68 recognizes the switching states of the sensing light beam L. Thus, it can be judged whether a correction of a reference position is properly carried out. However, when the first light-shielding plate 72 is omitted and only the second shielding plate 74 is disposed on the rotary table 48, the second light-shielding plate 74 may not have the light-transmitting hole 74A. In this case, the reference position may be defined as a position where the sensing light beam L is switched from the light-transmitting state to the light-shielding state and vice versa, by right and left ends of the second light-shielding plate 74.

Figure 10:
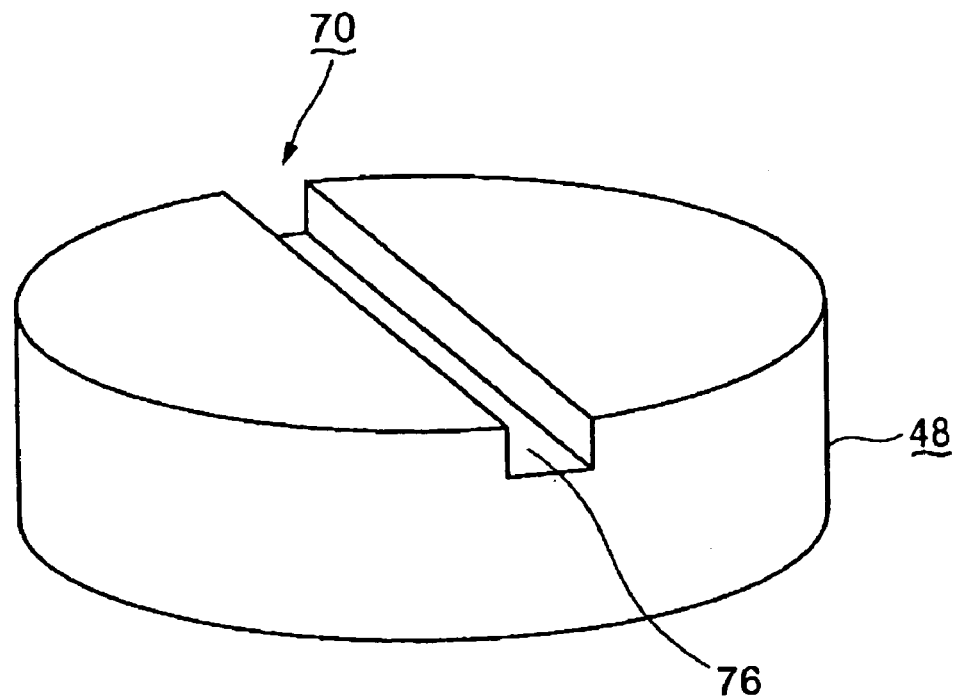
FIG. 10 is a perspective view of an alternative example of a light-shielding member.

The first embodiment shows the light-shielding member 70 formed of the light-shielding plates 72 and 74 for switching the sensing light beam L between the light-transmitting state and the light-shielding state within a small range of the rotary table 48 at a small turning angle. However, in place of the light-shielding plates 72 and 74, the light-shielding member 70 can be formed as shown in FIG. 10. FIG. 10 is a perspective view of an alternative example of the light-shielding member 70, in which members such as the arm mechanisms are omitted. The alternative example shown in FIG. 10 includes a groove 76 formed in an upper surface of the rotary table 48 along a diameter thereof, which allows a transmittance of the sensing light beam L. Thus, the groove 76 and a periphery thereof can be used as the light-shielding member 70 formed in the rotary table 48.

In the first embodiment, the two arm mechanisms 50 and 52 are disposed on the rotary table 48, with their turning shafts and connecting shafts for bending and stretching thereof being not coincident with each other. However, the present invention is not limited thereto. The present invention may be applied to a conveying mechanism of a different type. For example, the present invention can be applied to a conveying mechanism disclosed in Japanese Patent Laid-Open Publication No. 284049/1999, in which two articulated arms are disposed on an unrotatable table. Turning shafts of the two articulated arms are coaxially formed, and connecting shafts thereof are also coaxially formed.

Hereinbelow, referring to FIGS. 11 to 14, a reference position correcting device in a second embodiment of the present invention which can be applied to the conveying mechanism of such a different type is described. With respect to the parts having the same structure and function as those described in the first embodiment shown in FIGS. 1 and 2, the detailed description thereof will be omitted.

Figure 11:
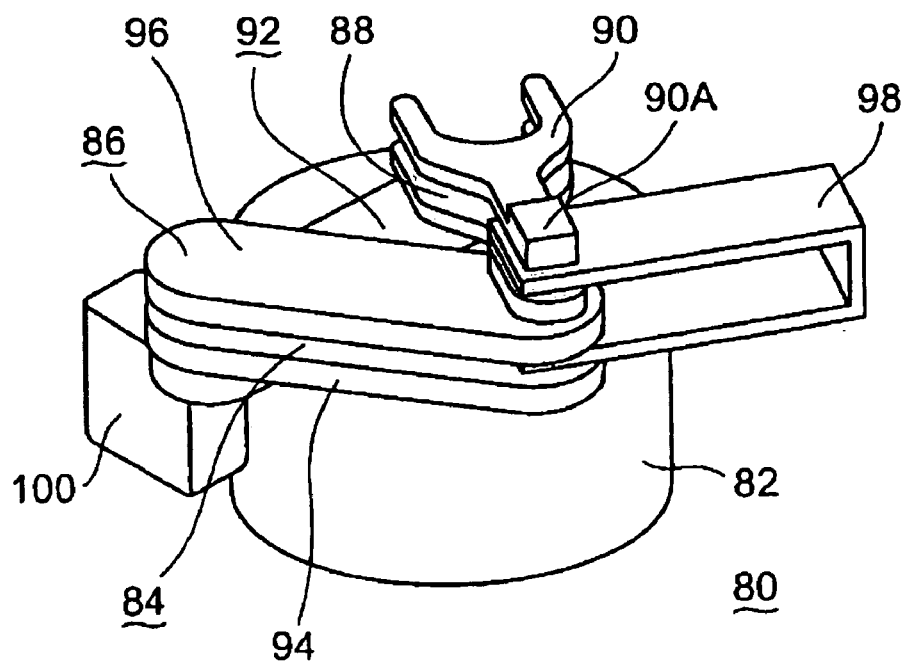
FIG. 11 is a perspective view of a conveying mechanism to which a reference position correcting device in a second embodiment of the present invention is applied.
Figure 12:
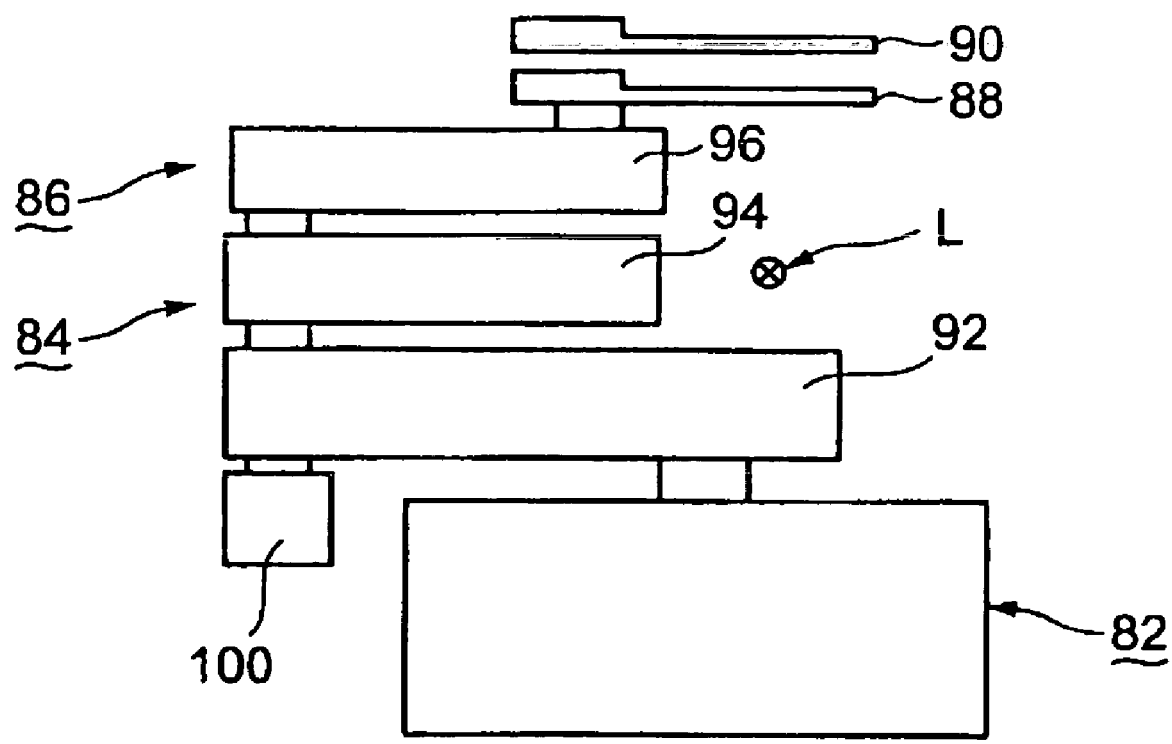
FIG. 12 is a schematic side view of the conveying mechanism shown in FIG. 11.
Figure 13:
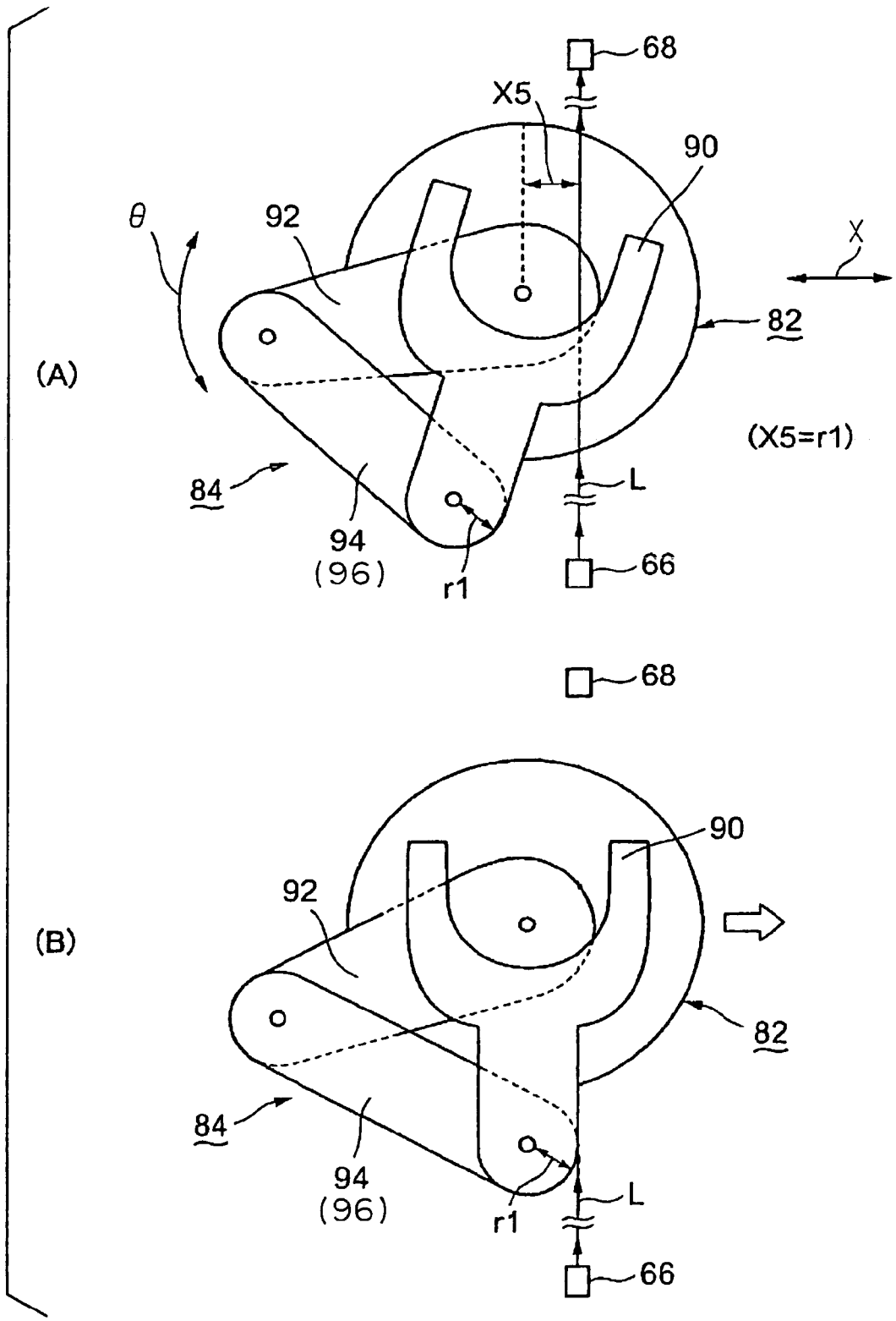
FIG. 13 is a schematic plan view when a reference position is corrected in the θ direction.

As shown in FIGS. 11 to 13, a conveying mechanism 80 in the second embodiment includes a cylindrical table 82. The table 82 is secured on the base 44 (FIG. 2) which can move in the Z direction, for example. Two arm mechanisms 84 and 86 are disposed on the table 82, which have coaxial turning shafts and coaxial connecting shafts. Picks 88 and 90 for holding a wafer are attached on distal ends of the respective arm mechanisms 84 and 86.

The arm mechanisms 84 and 86 include a common first arm 92, and second arms 94 and 96. A proximal end of the first arm 92 is attached on a center of the table 82, such that the first arm 92 can turn in the horizontal plane. The second arms 94 and 96 are connected to a distal end of the first arm 92 in a vertical arrangement. The second arms 94 and 96 can rotate independently from each other in the horizontal plane relative to the first arm 92. The one pick 88 is attached to a distal end of the upper second arm 96. The other pick 90 is attached to a distal end of the lower second arm 94 through an assisting arm 98. The picks 88 and 90 are rotatable in the horizontal plane with respect to the second arms 94 and 96, respectively. The assisting arm 98 formed into a U-shape prevents an interference between the picks 88 and 90. As shown in FIG. 13, each of distal ends of the respective second arms 94 and 96, i.e., each of side ends of the picks 88 and 90, is formed into an arc having a curvature radius r1 in plan view.

In FIGS. 12 and 13, the assisting arm 98 is omitted. A driving motor 100 for rotating the second arms 94 and 96 is disposed at a position where the first arm 92 is connected to the second arms 94 and 96.

A method of correcting a reference position of the conveying mechanism 80 as constituted above is described below.

<Reference Position Correction in X Direction>

A method of correcting a reference position in the X direction is similar to that of the first embodiment. By moving the table 82 in the X direction at a low speed, a position (X coordinate) where the sensing light beam L is switched from the light-transmitting state to the light-shielding sate is obtained. A reference position is corrected in the X direction, based on a deviation amount of the X coordinate.

<Reference Position Correction in Z Direction>

A method of correcting a reference position in the Z direction is similar to that of the first embodiment. However, there is no light-shielding member such as a light-shielding plate. Thus, the sensing light beam L is switched between the light-transmitting state and the light-shielding state by an upper surface (upper end) of the table 82. That is, by raising the table 82 in the Z direction at a low speed, a position (Z coordinate) where the sensing light beam L is switched from the light-transmitting state to the light-shielding state, when the upper end of the table 82 shields the sensing light beam L, is obtained. A reference position is corrected in the Z direction, based on a deviation amount of the Z coordinate.

The sensing light beam L may be switched from the light-transmitting state to the light-shielding state, by parts of the arm mechanisms 84 and 86 or the picks 88 and 90.

<Reference Position Correction in θ Direction>

In order to correct a reference position in the θ direction, a θ axis coordinate where the sensing light beam L is switched between the light-transmitting state and the light-shielding state by the second arms 94 and 96 is obtained. A method of correcting a reference position in the θ direction is common to both the arm mechanisms 84 and 86. Thus, a method of correcting a reference position in the θ direction for the arm mechanism 84 is described.

As shown in FIGS. 12 and 13(A), the table 82 is moved in the X and Z directions where the reference positions have been corrected. A position of the arm mechanism 84 is adjusted such that the distal end of the second arm 94 is spaced slightly apart from the sensing light beam L in the X direction, and is aligned with the sensing light beam L at substantially the same horizontal level in the Z direction. Simultaneously, the arm mechanism 84 is bent at a predetermined bending angle. In the drawings, the arm mechanism 84 is bent at a large bending angle so as to be collapsed. As shown in FIG. 13(A), in the X direction, the arm mechanism 84 is positioned such that a distance X5 between the turning center of the arm mechanism 84 and the sensing light beam L corresponds to a length of the curvature radius r1 of the distal end of the second arm 94 (that is, X5=r1).

Then, while maintaining such a posture, the first arm 92 of the arm mechanism 84 is slowly turned in the θ direction (counterclockwise in FIG. 13). When the distal end of the second arm 94 shields the sensing light beam L, a position (θ coordinate) where the sensing light beam L is switched from the light-transmitting state to the light-shielding state is obtained. A reference position is corrected in the θ direction, based on a deviation amount in the θ direction.

Figure 14:
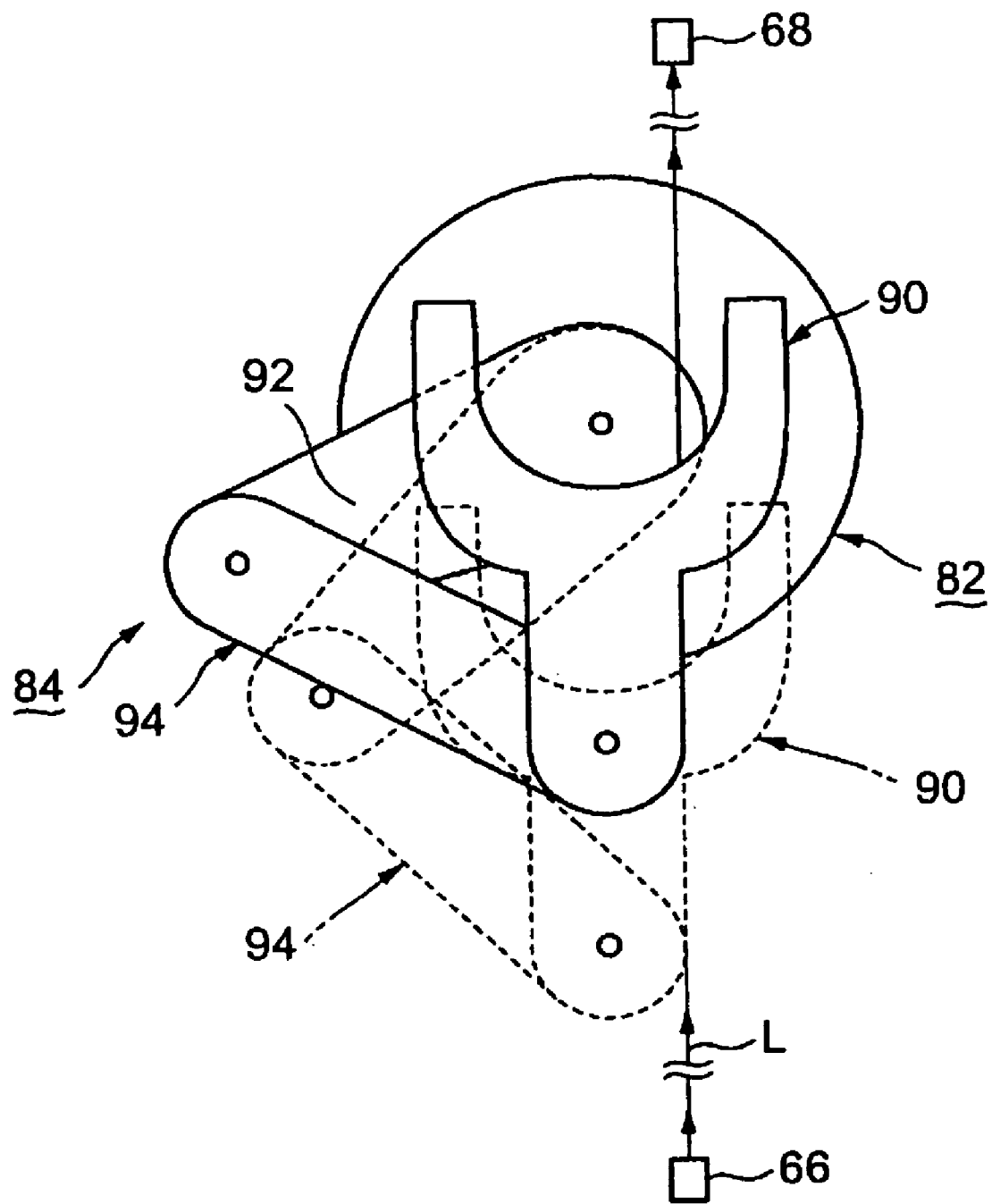
FIG. 14 is a schematic plan view of an arm mechanism whose collapsed state is different from that shown in FIG. 13.

In this case, as shown in FIG. 14, when the bending state of the arm mechanism 84 is different from that shown in FIG. 13, no influence is given to a reference position correction.

<Reference Position Correction in R Direction>

A method of correcting a reference position in the R direction is similar to that of the first embodiment. That is, the table 82 is moved in the X direction at a low speed, with one of the conveying arm mechanisms, e.g., the arm mechanism 84 being bent at a predetermined bending angle. When the thickened attachment part 90A (FIG. 11) of the pick 90 of the arm mechanism 84 shields the sensing light beam L, a position (X coordinate) where the sensing light beam L is switched from the light-transmitting state to the light-shielding state is obtained. A reference position is corrected in the R direction, based on a deviation amount in the R direction.

In the above embodiments, although the conveying mechanism includes the two arm mechanisms, the present invention is not limited thereto. For example, the present invention can be naturally applied to a conveying mechanism including a single arm mechanism.

Not limited to a fabrication or remodeling of a system, a reference position correction for a conveying mechanism in the respective directions can be carried out at both regular and irregular intervals, taking circumstances such as changes over time in the system into consideration. In the above embodiments, a conveying mechanism disposed in an inlet-side conveying vessel is explained as an example. However, the present invention can be applied to all conveying mechanisms, as long as the conveying mechanism is moved along the four axis, that is, in the X, Z, θ, and R directions.

As an object to be conveyed, the present invention may be applied not only to a semiconductor wafer, but also to an LCD substrate, a glass substrate, and so on.

The invention claimed is:

1. A reference position correcting device for a conveying mechanism including: a moving member disposed in a conveying vessel, the moving member being capable of moving in a horizontal moving direction; a rotary table attached to the moving member, the rotary table being capable of turning in a horizontal turning direction and moving in a vertical direction; two arm mechanisms attached to the rotary table through vertical rotary shafts spaced apart from each other, the arm mechanisms being capable of bending and stretching in a horizontal operating direction; and picks attached on distal ends of the respective arm mechanisms, each for holding an object to be conveyed; said correcting device comprising:

a light emitter fixedly positioned on the conveying vessel, for emitting a sensing light beam in a horizontal direction crossing the moving direction of the moving member;

a light detector fixedly positioned on the conveying vessel to receive the sensing light beam, for detecting a light-transmitting state and a light-shielding state of the sensing light beam;

a light-shielding member attached on the rotary table, for switching the sensing light beam between the light-transmitting state and the light-shielding state in compliance with a movement and a turn of the rotary table; and correcting means for correcting reference positions of the rotary table in the moving, vertical, and turning directions, and for correcting a reference position of the arm mechanism in the operating direction, based on a detection by the light detector about the light-transmitting state and the light-shielding state of the sensing light beam switched in compliance with the movement and the turn of the rotary table.

2. The reference position correcting device according to claim 1, wherein the correction means corrects:

the reference position of the rotary table in the moving direction, based on a position where a horizontal end of the rotary table switches the sensing light beam between the light-transmitting state and the light-shielding state;

the reference position of the rotary table in the vertical direction, based on a position where an upper end of the rotary table or the light-shielding member switches the sensing light beam between the light-transmitting state and the light-shielding state;

the reference position of the rotary table in the turning direction, based on a position where the light-shielding member switches the sensing light beam between the light-transmitting state and the light-shielding state; and the reference position of the arm mechanism in the operating direction, based on a position where a part of the pick or a part of the arm mechanism switches the sensing light beam between the light-transmitting state and the light-shielding state.

3. The reference position correcting device according to claim 1 or 2, wherein the light-shielding member is formed of a light-shielding plate projecting upward from an upper surface of the rotary table.

4. The reference position correcting device according to claim 3, wherein the light-shielding member includes a first light-shielding plate disposed on a rotary center of the rotary table, and a second light-shielding plate disposed at a peripheral portion of the rotary table; and each of the light-shielding plates has a light-transmitting hole formed in a center thereof.

5. The reference position correcting device according to claim 1 or 2, wherein an attachment part of the pick to the arm mechanism has a larger thickness in the vertical direction than those of other parts of the pick; and when the reference position of the arm mechanism is corrected in the operating direction, the attachment part of the pick switches the sensing light beam between the light-transmitting state and the light-shielding state.

6. The reference position correcting device according to claim 1 or 2, wherein the distal end of the arm mechanism on which the pick is attached is formed into an arc shape in plan view; and when the reference position of the arm mechanism is corrected in the operating direction, the distal end of the arm mechanism switches the sensing light beam between the light-transmitting state and the light-shielding state.

7. A reference position correcting device for a conveying mechanism including: a moving member disposed in a conveying vessel, the moving member being capable of moving in a horizontal moving direction; a table attached to the moving member, the table being capable of moving in a vertical direction; an arm mechanism attached to the table, the arm mechanism being capable of turning in a horizontal turning direction and bending and stretching in a horizontal operating direction; and a pick attached on a distal end of the arm mechanism, for holding an object to be conveyed; said correcting device comprising:

a light emitter fixedly positioned on the conveying vessel, for emitting a sensing light beam in a horizontal direction crossing the moving direction of the moving member;

a light detector fixedly positioned on the conveying vessel to receive the sensing light beam, for detecting a light-transmitting state and a light-shielding state of the sensing light beam; and correcting means for correcting reference positions of the table in the moving and vertical directions, and for correcting reference positions of the arm mechanism in the turning and the operating directions, based on a detection by the light detector about the light-transmitting state and the light-shielding state of the sensing light beam switched in compliance with the movement of the table and the turn of the arm mechanism.

8. The reference position correcting device according to claim 7, wherein the correcting means corrects:

the reference position of the table in the moving direction, based on a position where a horizontal end of the table switches the sensing light beam between the light-transmitting state and the light-shielding state;

the reference position of the table in the vertical direction, based on a position where a part of the arm mechanism, a part of the pick, or an upper end of the table switches the sensing light beam between the light-transmitting state and the light-shielding stated;

the reference position of the arm mechanism in the turning direction, based on a position where a part of the arm mechanism switches the sensing light beam between the light-transmitting state and the light-shielding state; and the reference position of the arm mechanism in the operating direction, based on a position where a part of the pick or a part of the arm mechanism switches the sensing light beam between the light-transmitting state and the light-shielding state.

9. The reference position correcting device according to claim 7 or 8, wherein an attachment part of the pick to the arm mechanism has a larger thickness in the vertical direction than those of other parts of the pick; and when the reference position of the arm mechanism is corrected in the operating direction, the attachment part of the pick switches the sensing light beam between the light-transmitting state and the light-shielding state.

10. The reference position correcting device according to claim 7 or 8, wherein the distal end of the arm mechanism on which the pick is attached is formed into an arc shape in plan view; and when the reference position of the arm mechanism is corrected in the operating direction, the distal end of the arm mechanism switches the sensing light beam between the light-transmitting state and the light-shielding state.

11. The reference position correcting device according to claim 7 or 8, wherein the arm mechanism includes: a first arm attached on the table, the first arm being capable of turning in the horizontal turning direction; and two second arms connected to a distal end of the first arm such that the second arms can rotate in the horizontal plane independently from each other, each of the second arms having the pick attached on a distal end thereof; and when the reference position of the arm mechanism is corrected in the turning direction, a part of the second arm switches the sensing light beam between the light-transmitting state and the light-shielding state.

12. The reference position correcting device according to claim 11, wherein an attachment part of each of the picks to the second arms has a larger thickness in the vertical direction than those of other parts of the pick; and when the reference position of the arm mechanism is corrected in the operating direction, the attachment part of each of the picks switches the sensing light beam between the light-transmitting state and the light-shielding stated.

13. The reference position correcting device according to claim 11, wherein the distal end of each of the second arms on which the pick is attached is formed into an arc shape in plan view; and when the reference position of the arm mechanism is corrected in the operating direction, the distal end of each of the second arms switches the sensing light beam between the light-transmitting state and the light-shielding state.

14. A method of correcting reference positions of a conveying mechanism including: a moving member disposed in a conveying vessel, the moving member being capable of moving in a horizontal moving direction; a rotary table attached to the moving member, the rotary table being capable of turning in a horizontal turning direction and moving in a vertical direction; two arm mechanisms attached to the rotary table through vertical rotary shafts spaced apart from each other, the arm mechanisms being capable of bending and stretching in a horizontal operating direction; and picks attached on distal ends of the respective arm mechanisms, each for holding an object to be conveyed; said method comprising the steps of:

emitting a sensing light beam from a light emitter to a light detector each being fixedly positioned on the conveying vessel, in a horizontal direction crossing the moving direction of the moving member;

correcting the reference position of the rotary table in the moving direction, based on a position where a horizontal end of the rotary table switches the sensing light beam between a light-transmitting state and a light-shielding state;

correcting the reference position of the rotary table in the vertical direction, based on a position where an upper end of the rotary table or a light-shielding member attached on the rotary table switches the sensing light beam between the light-transmitting state and the light-shielding state;

correcting the reference position of the rotary table in the turning direction, based on a position where the light-shielding member switches the sensing light beam between the light-transmitting state and the light-shielding state; and correcting the reference position of the arm mechanism in the operating direction, based on a position where a part of the pick or a part of the arm mechanism switches the sensing light beam between the light-transmitting state and the light-shielding state.

15. A method of correcting reference positions of a conveying mechanism including: a moving member disposed in a conveying vessel, the moving member being capable of moving in a horizontal moving direction; a table attached to the moving member, the table being capable of moving in a vertical direction; an arm mechanism attached to the table, the arm mechanism being capable of turning in a horizontal turning direction and bending and stretching in a horizontal operating direction; and a pick attached on a distal end of the arm mechanism, for holding an object to be conveyed; said method comprising the steps of:

emitting a sensing light beam from a light emitter to a light detector each being fixedly positioned on the conveying vessel, in a horizontal direction crossing the moving direction of the moving member;

correcting the reference position of the table in the moving direction, based on a position where a horizontal end of the table switches the sensing light beam between a light-transmitting state and a light-shielding state;

correcting the reference position of the table in the vertical direction, based on a position where a part of the arm mechanism, a part of the pick, or an upper end of the table switches the sensing light beam between the light-transmitting state and the light-shielding state;

correcting the reference position of the arm mechanism in the turning direction, based on a position where a part of the arm mechanism switches the sensing light beam between the light-transmitting state and the light-shielding state; and correcting the reference position of the ram mechanism in the operating direction, based on a position where a part of the pick or a part of the arm mechanism switches the sensing light beam between the light-transmitting state and the light-shielding state.

* * * * *